US009552026B2

United States Patent
Chang

(10) Patent No.: US 9,552,026 B2
(45) Date of Patent: Jan. 24, 2017

(54) MOBILE TERMINAL

(71) Applicant: HON HAI PRECISION INDUSTRY CO., LTD., New Taipei (TW)

(72) Inventor: Shao-Han Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 136 days.

(21) Appl. No.: 14/496,649

(22) Filed: Sep. 25, 2014

(65) Prior Publication Data
US 2015/0131225 A1 May 14, 2015

(30) Foreign Application Priority Data

Nov. 11, 2013 (CN) .......................... 2013 1 0551899

(51) Int. Cl.
G06F 1/20 (2006.01)
H04M 1/02 (2006.01)
H05K 7/20 (2006.01)
H04M 1/21 (2006.01)

(52) U.S. Cl.
CPC ............ *G06F 1/203* (2013.01); *H04M 1/0202* (2013.01); *H05K 7/20445* (2013.01); *H04M 1/21* (2013.01)

(58) Field of Classification Search
CPC ...... H01L 23/576; H01L 23/58; G06F 1/1626; G06F 1/1632; G06F 1/1637; G06F 1/1684; G06F 1/16; G06F 1/1613; G06F 1/20; H04M 1/0202; H04M 1/21; H05K 7/20445
USPC ............... 361/690, 704, 715, 717, 722, 725
See application file for complete search history.

(56) References Cited

U.S. PATENT DOCUMENTS

| | | | | | |
|---|---|---|---|---|---|
| 4,629,604 | A | * | 12/1986 | Spector | A01M 1/2077 261/DIG. 88 |
| 5,300,809 | A | * | 4/1994 | Nakamura | H01L 23/3735 257/684 |
| 5,887,118 | A | * | 3/1999 | Huffman | A61M 15/00 361/679.32 |
| 7,310,539 | B2 | * | 12/2007 | Chiang | H04M 1/21 455/567 |
| 7,651,666 | B2 | * | 1/2010 | Adair | A01M 1/2077 219/392 |
| 7,839,396 | B2 | * | 11/2010 | Yang | G02F 1/13452 345/204 |
| 7,952,881 | B2 | * | 5/2011 | Magana | H04B 1/036 165/185 |

(Continued)

FOREIGN PATENT DOCUMENTS

| | | |
|---|---|---|
| CN | 201252711 Y | 6/2009 |
| CN | 101757667 A | 6/2010 |

(Continued)

*Primary Examiner* — Adam B Dravininkas
(74) *Attorney, Agent, or Firm* — Zhigang Ma

(57) ABSTRACT

A heat-dissipating mobile terminal includes a main body, a heat dissipating member positioned in the main body, and a back cover detachably connected to the main body. The main body includes a heat-producing element and the heat dissipating member includes a heat radiator arranged above the heat-producing element. The back cover defines a perforated portion above the heat dissipating member. The heat radiator is integrated with the main body. The heat radiator is exposed to external cooler air by the perforated portion in the back cover. The mobile terminal of the present disclosure effectively improves heat radiating efficiency and reduces cost.

11 Claims, 6 Drawing Sheets

(56) References Cited

U.S. PATENT DOCUMENTS

| | | | |
|---|---|---|---|
| 8,111,513 B2* | 2/2012 | Yeh | G06F 1/20 165/104.33 |
| 2004/0203412 A1* | 10/2004 | Greco | H04M 1/21 455/66.1 |
| 2005/0013728 A1* | 1/2005 | Huang | A61L 9/03 422/4 |
| 2005/0111194 A1* | 5/2005 | Sohn | H01L 23/3672 361/704 |
| 2008/0070567 A1* | 3/2008 | Sadler | A61L 9/02 455/425 |
| 2013/0141866 A1* | 6/2013 | Refai-Ahmed | H01L 23/3672 361/679.54 |
| 2013/0164178 A1* | 6/2013 | Carmichael | A61L 9/12 422/123 |
| 2014/0092561 A1* | 4/2014 | Chen | G06F 1/181 361/720 |

FOREIGN PATENT DOCUMENTS

| | | |
|---|---|---|
| CN | 102083295 A | 6/2011 |
| CN | 202496170 U | 10/2012 |
| CN | 103220896 A | 7/2013 |
| TW | M280025 U | 11/2005 |
| TW | M346269 U | 12/2008 |
| TW | 201332425 A | 8/2013 |

* cited by examiner

MOBILE TERMINAL

FIELD

The subject matter herein generally relates to the field of heat dissipation.

BACKGROUND

A mobile terminal may include a main body and a speaker unit for providing audible information. An upper cover may have a display for displaying a text and other information. A lower cover may be coupled to the upper cover to cooperatively form a space in which various components can be mounted. A printed circuit board (PCB) may be installed in the space. In receiving/transmitting information or using its various functions (such as games or the like), a user may press the display with a finger to input information.

The components of the printed circuit board inevitably generate heat due to collisions of electrons caused by operation of the component.

The heat generally cannot evenly spread through out but concentrates on a specific portion thereby forming a hot area. The upper cover is usually the hottest part. Thus, when a user touches the mobile terminal, the user may feel the heat. Furthermore, life span and performance of components of the printed circuit board may deteriorate due to the heating over an extended period.

BRIEF DESCRIPTION OF THE DRAWINGS

Implementations of the present technology will now be described, by way of example only, with reference to the attached figures.

DETAILED DESCRIPTION

Figure 1:
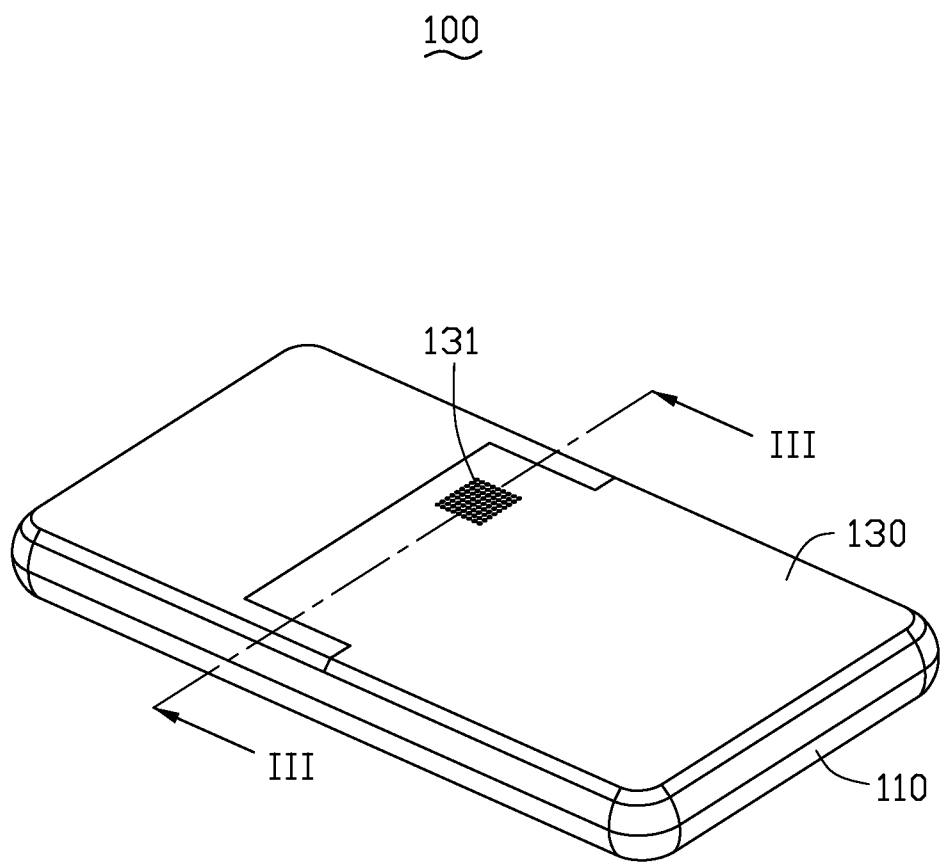
FIG. 1 is a perspective view of a mobile terminal according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape, or other feature that the terms modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates a mobile terminal 100 according to an embodiment of the present disclosure which can include a main body 110 and a back cover 130 detachably connected to the main body 110. The main body 110 and the back cover 130 can form a space in which various components can be mounted. The back cover 130 can define a perforated portion 131 to allow the heat from the mobile terminal 100 to escape.

Figure 2:
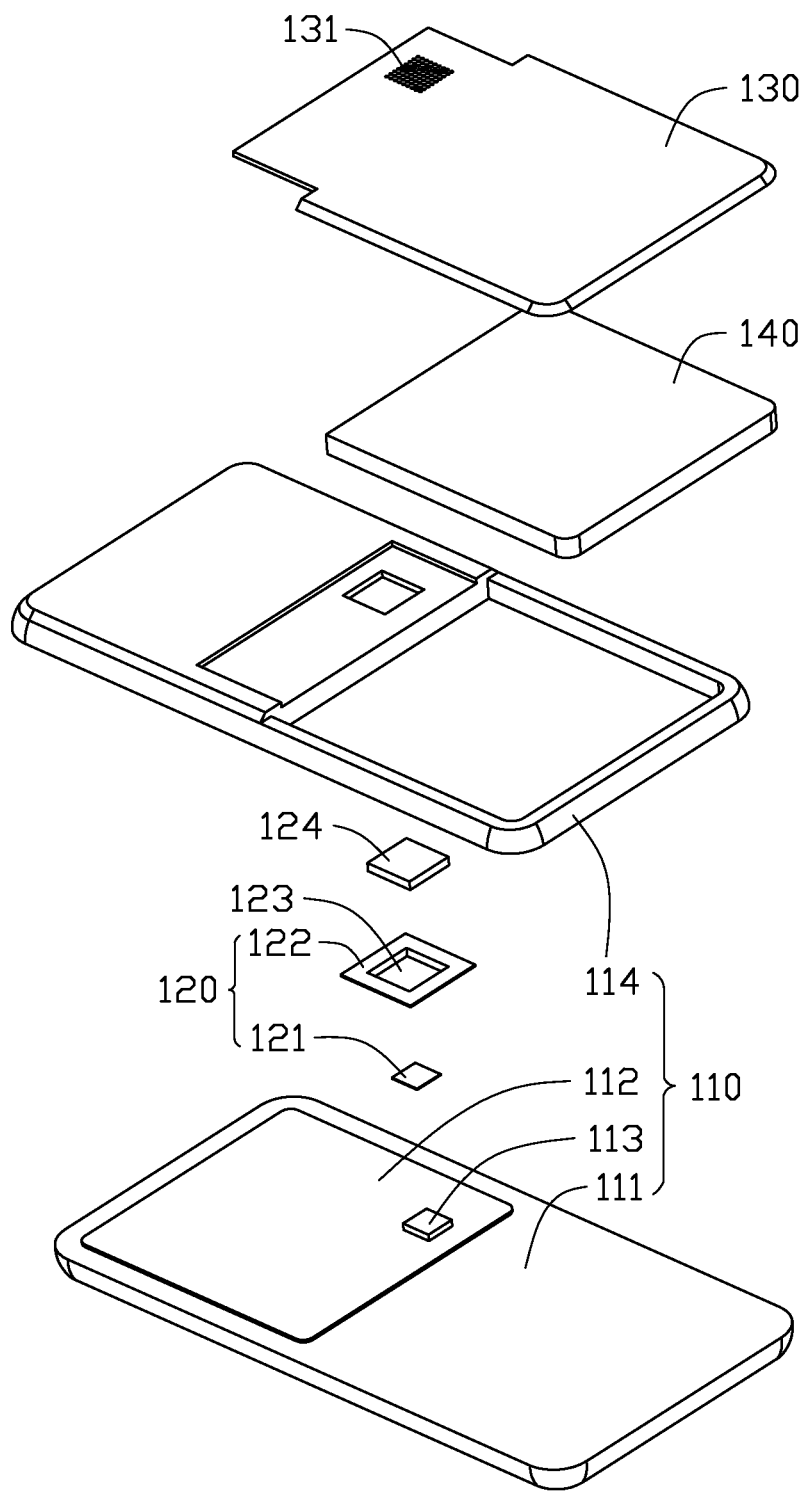
FIG. 2 is an exploded perspective view of the mobile terminal as shown in FIG. 1.

FIG. 2 illustrates that the mobile terminal 100 can further include a heat dissipating member 120 positioned in the main body 110 and a battery 140 mounted in the main body 110 to supply electrical energy.

The main body 110 can include a front panel 111, a printed circuit board (PCB) 112, a heat-producing element 113 and a back panel 114. The front panel 111 can be used to install a display and/or a keyboard. The PCB 112 can be positioned on the front panel 111 to allow the connection of various components. The heat-producing element 113 installed on the PCB 112 can be a wireless-fidelity (WIFI) power amplification chip, a global positioning system (GPS) chip, or an audio-frequency power amplification chip. The heat-producing element 113 can generate a large amount of heat.

The heat dissipating member 120 can include a heat-conducting pad 121 and a heat radiator 122. The heat-conducting pad 121 can be made of a thermally conductive material. A size of the heat-conducting pad 121 can be matched with a size of the upper surface of the heat-producing element 113 to remove the heat from the heat-producing element 113 to the heat radiator 122. The heat radiator 122 can be a substantially rectangular plate with a concave portion 123 in a central portion thereof. The heat radiator 122 can be attached to the back panel 114. In other embodiments, the heat radiator 122 can be another shape of flat plate. The heat radiator 122 can be made of a metal coated by an insulating layer. The heat radiator 122 with an insulating layer can prevent the heat-producing element 113 from short circuiting when the heat-producing element 113 makes contact with the heat radiator 122.

The heat radiator 122 can be used as an aromatherapy diffuser. A plurality of volatile aromatic blocks 124 can be positioned in the heat radiator 122. The aromatic blocks 124 can be volatilize by absorbing the heat of the heat radiator 122. As the back cover 130 can be detachably connected to the main body 110, the back cover 130 can be removed to change the aromatic blocks 124.

The two sides of the back cover 130 can detachably connected to the corresponding sides of the back panel 114, thus the back cover 130 can be easily installed or demounted from the back panel 114.

Figure 3:
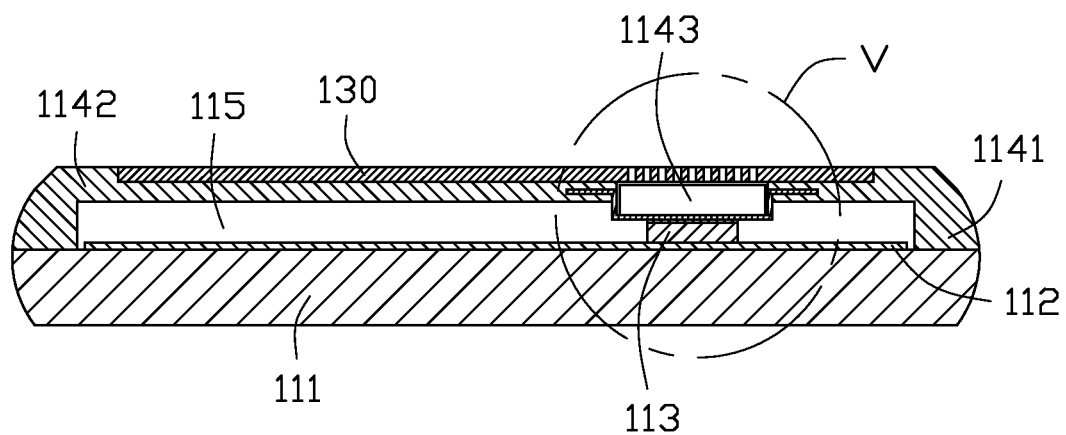
FIG. 3 is a cross-sectional view of the mobile terminal taken along a line III-III of FIG. 1.

FIG. 3 illustrates that the back panel 114 (as shown in FIG. 2) can include a support wall 1141 and a base-cover 1142 connected with the support wall 1141. The support wall 1141 can be detachably connected with the front panel 111. The support wall 1141, the base-cover 1142 and the front panel 111 can cooperatively form a receiving portion 115. The PCB 112 and the heat-producing element 113 can be received in the receiving portion 115. The base-cover 1142 can define an opening 1143 on the top of the heat-producing element 113, and the opening 1143 can be configured for receiving the heat dissipating member 120 (as shown in FIG. 2) therein. The opening 1143 can be adapted to application requirements of the heat dissipating member 120.

Figure 4:
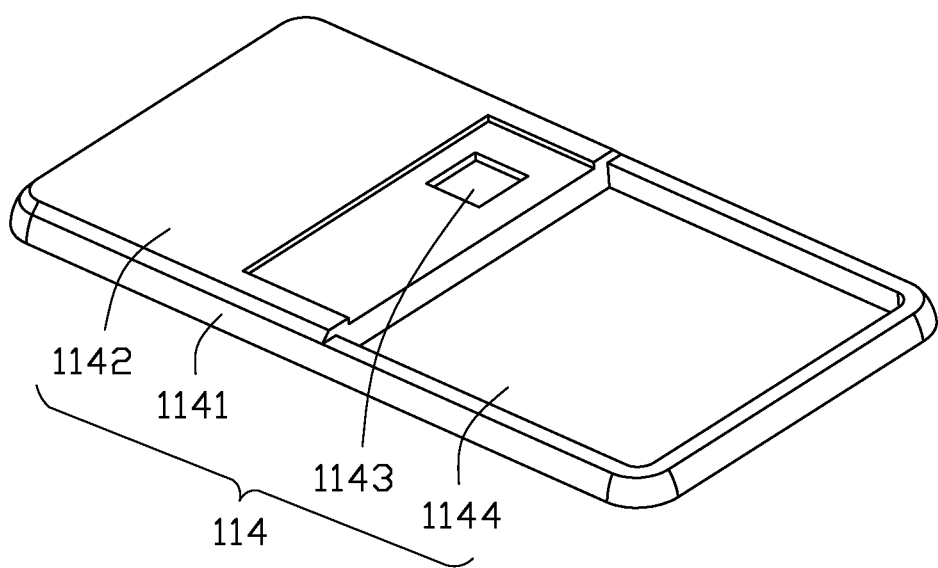
FIG. 4 is a perspective view of a back cover of the mobile terminal as shown in FIG. 1.

FIG. 4 illustrates that the back panel 114 can be a substantially rectangular plate. The opening 1143 can be located in the substantially central position of the back panel 114, and can be a squared opening. The back panel 114 can further include a receiving groove 1144 configured to receive the battery 140.

Figure 5:
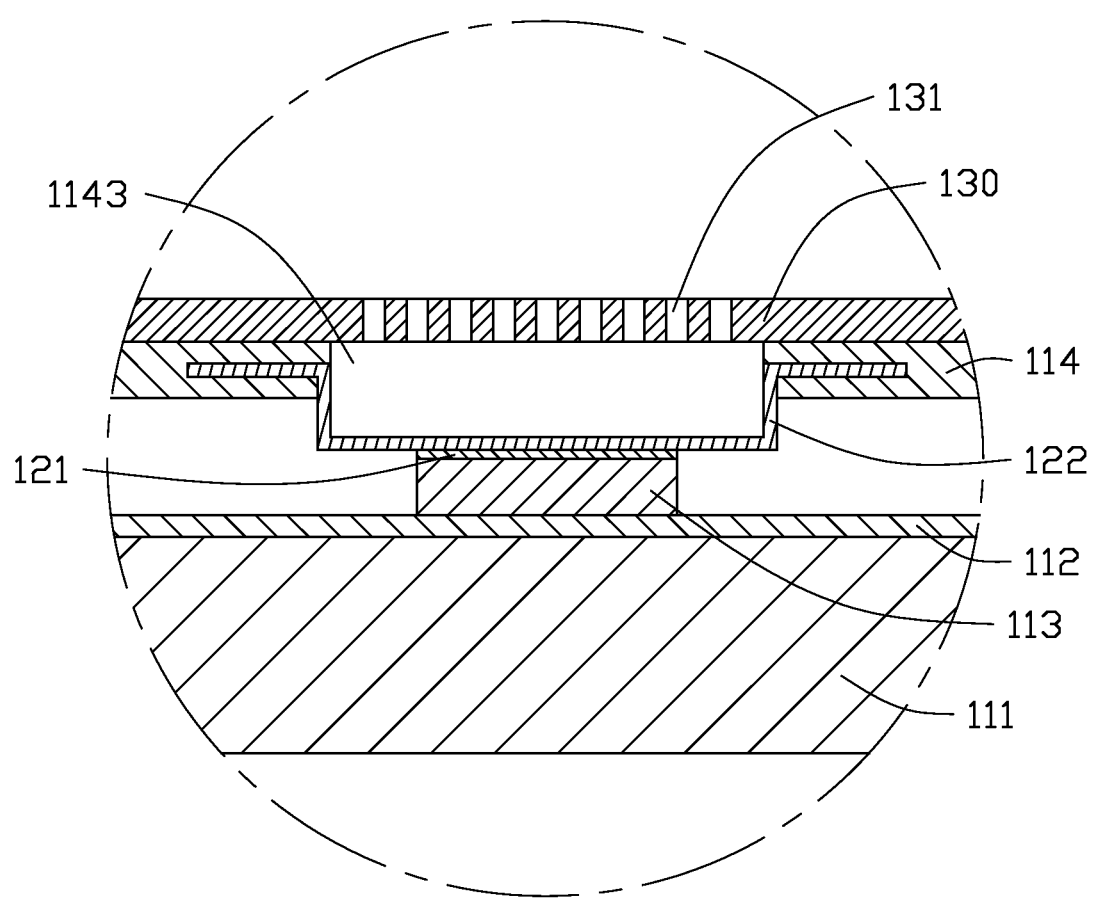
FIG. 5 is an enlarged view of circled portion V of FIG. 3.

FIG. 5 illustrates that the heat-conducting pad 121 can be sandwiched between the heat-producing element 113 and the heat radiator 122, and can be in close contact with the heat-producing element 113 and the heat radiator 122. One surface of the heat-conducting pad 121 can be attached to the upper surface of the heat-producing element 113, and the other surface of the heat-conducting pad 121 can be attached to the heat radiator 122. The heat-conducting pad 121 can remove the heat from the heat-producing element 113 and pass it to the heat radiator 122. The heat radiator 122 can be positioned in the opening 1143 by embedded forming. In at least one embodiment, the heat radiator 122 can be integrated with the main body 110. A size of the heat radiator 122 is greater than the upper surface of the heat-producing element 113 to increase the heat dissipation area. The opening 1143 can be defined on the top of the heat-producing element 113. The heat radiator 122 can be positioned in the back panel 114 via the opening 1143, and the perforated portion 131 can be on the top of the heat radiator 122.

External air can pass into the back cover 130 via the perforated portion 131 and flow over the heat dissipating member 120 to remove the heat from the mobile terminal 100. The heat dissipating member 120 can effectively improve the heat radiating efficiency and reduce the cost of the mobile terminal 100 without comprising the safety of the product.

Figure 6:
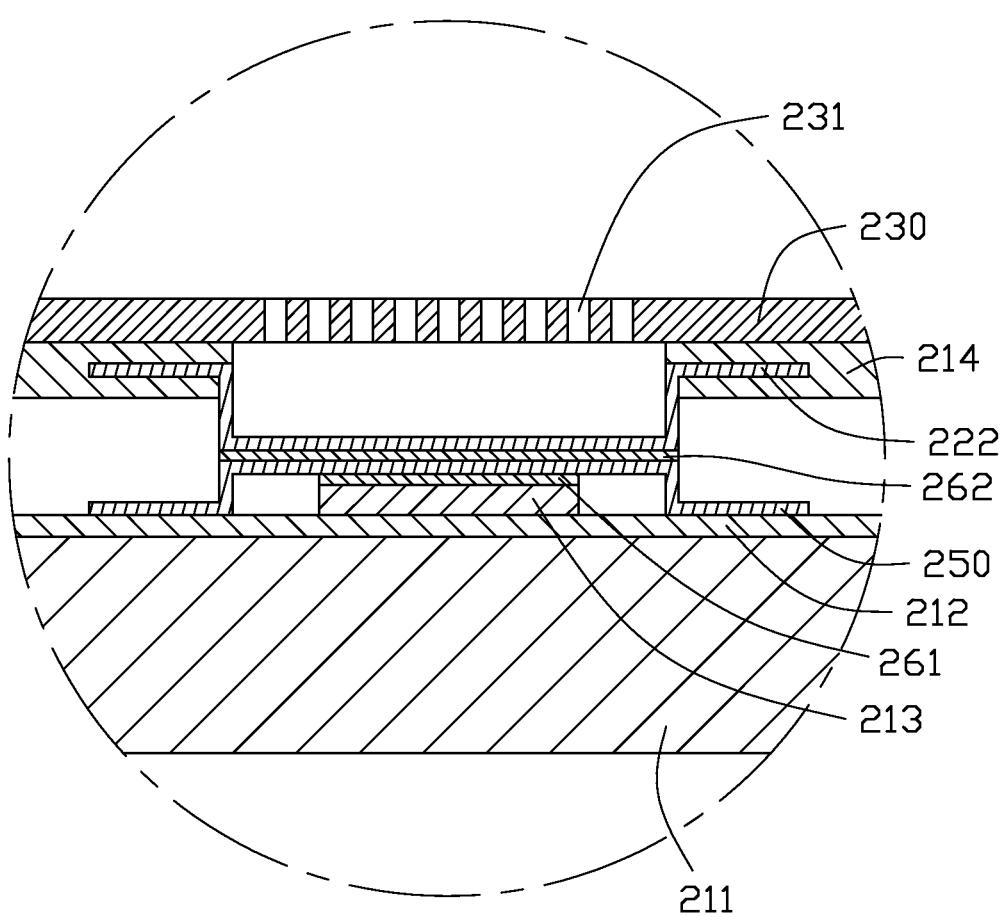
FIG. 6 is an enlarged view of a circled portion according to another embodiment of this disclosure.

FIG. 6 illustrates a mobile terminal 100 according to another embodiment of the present disclosure, including a front panel 211, a PCB 212 positioned on the front panel 211, a heat-producing element 213 positioned on the PCB 212, and a back panel 214. A heat radiator 222 can be integrated with the back panel 214. A protective cap 250 can be above, and cover, the heat-producing element 213. The protective cap 250 can be a metal cap used to reduce electromagnetic interference. A first heat-conducting pad 261 can be positioned between the heat-producing element 213 and the protective cap 250. A size of the first heat-conducting pad 261 can match a size of the heat-producing element 213 to remove the heat from the heat-producing element 213 and pass it to the protective cap 250. A second heat-conducting pad 262 can be positioned between the protective cap 250 and the heat radiator 222. A size of the second heat-conducting pad 262 can match a size of the protective cap 250 to remove the heat from the protective cap 250 and pass it to the heat radiator 222.

A perforated portion 231 in the back cover 230 have direct access to the heat radiator 222 and there is no impediment preventing the cooler external air removing the heat from the mobile terminal 100. The heat radiator 222 can effectively improve the heat radiating efficiency and reduce the cost of the mobile terminal 100 without affecting the safety of the product.

The embodiments shown and described above are only examples. Many details are often found in the art such as the other features of the backlight module 100. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to, and including the full extent established by the broad general meaning of the terms used in the claims. It will therefore be appreciated that the embodiments described above may be modified within the scope of the claims.

What is claimed is:

1. A mobile terminal comprising:
   a main body having a front panel, a printed circuit board positioned on the front panel, a back panel detachably connected with the front panel and a back cover detachably connected to the back panel;
   a heat-producing element enclosed within the main body; and
   a heat dissipating member enclosed within the main body, and the heat dissipating member having a heat radiator integral with the main body;
   wherein the back panel comprises a support wall, a base-cover connected to the support wall, and a receiving groove configured to receive a battery, and wherein the support wall is detachably connected to the front panel, and wherein the support wall, the base-cover and the front panel cooperatively form a receiving portion for receiving the printed circuit board and the heat-producing element;
   wherein the back cover includes a perforated portion; and
   wherein the heat dissipating member is positioned between the heat-producing element and the perforated portion of the back cover.

2. The mobile terminal of claim 1, wherein the heat radiator is made of a metal coated by an insulating layer.

3. The mobile terminal of claim 1, wherein a size of the heat radiator is greater than a size of the upper surface of the heat-producing element.

4. The mobile terminal of claim 1, wherein the heat radiator is a substantially rectangular plate having a concave portion in the central portion thereof.

5. The mobile terminal of claim 1, wherein the heat dissipating member further comprises a heat-conducting pad positioned between the heat-producing element and the heat radiator, and the heat-conducting pad is in close contact with the heat-producing element and the heat radiator.

6. The mobile terminal of claim 5, wherein the heat-conducting pad is made of a thermally conductive material.

7. The mobile terminal of claim 1, wherein the back panel defines an opening, and the heat radiator is positioned in the opening.

8. The mobile terminal of claim 1, wherein the heat radiator is integrated with the back panel.

9. The mobile terminal of claim 1, wherein a protective cap is covered above the heat-producing element, and two heat-conducting pads are positioned on the two opposite surfaces of the protective cap.

10. The mobile terminal of claim 9, wherein the protective cap is a metal cap.

11. The mobile terminal of claim 1, wherein the heat radiator is used as an aromatherapy diffuser, and a volatile aromatic block is positioned in the heat radiator.

\* \* \* \* \*